United States Patent
Ohama et al.

(10) Patent No.: US 6,886,364 B2
(45) Date of Patent: May 3, 2005

(54) METHOD FOR PRODUCING QUARTZ GLASS CRUCIBLE

(75) Inventors: Yasuo Ohama, Takefu (JP); Shigeo Mizuno, Takefu (JP)

(73) Assignees: Heraeus Quarzglas GmbH & Co. KG, Hanau (DE); Shin-Etsu Quartz Products Co. Ltd., Tokyo (JP)

( * ) Notice: Subject to any disclaimer, the term of this patent is extended or adjusted under 35 U.S.C. 154(b) by 422 days.

(21) Appl. No.: 10/048,675

(22) PCT Filed: May 31, 2001

(86) PCT No.: PCT/EP01/06181

§ 371 (c)(1),
(2), (4) Date: Apr. 25, 2002

(87) PCT Pub. No.: WO01/92169

PCT Pub. Date: Dec. 6, 2001

(65) Prior Publication Data

US 2003/0074920 A1 Apr. 24, 2003

(30) Foreign Application Priority Data

May 31, 2000 (JP) .................................. 2000-163644

(51) Int. Cl.⁷ .................................................. C03B 8/04
(52) U.S. Cl. ............................ 65/17.3; 65/17.4; 65/30.1
(58) Field of Search .......................... 65/17.4, 30.1, 65/33.1, 33, DIG. 8, 173, 17.5, 425, 427, 474, 17.3, 417, 419, 420, 378

(56) References Cited

U.S. PATENT DOCUMENTS

| | | | | |
|---|---|---|---|---|
| 3,835,230 A | * | 9/1974 | Valchev et al. | ............. 373/108 |
| 3,929,457 A | * | 12/1975 | Stenkvist | ...................... 373/88 |
| 4,389,235 A | | 6/1983 | Jung | |
| 4,632,686 A | | 12/1986 | Brown et al. | |
| 4,935,046 A | * | 6/1990 | Uchikawa et al. | ........... 65/17.4 |
| 5,989,021 A | * | 11/1999 | Sato et al. | .................. 432/264 |
| 6,106,610 A | * | 8/2000 | Watanabe et al. | .............. 117/13 |
| 6,381,987 B1 | * | 5/2002 | Werdecker et al. | .......... 65/17.5 |
| 6,510,707 B2 | * | 1/2003 | Kemmochi et al. | .......... 65/17.3 |
| 6,546,754 B1 | * | 4/2003 | Hansen et al. | ................. 65/144 |
| 6,548,131 B1 | * | 4/2003 | Fabian et al. | .............. 428/34.4 |
| 6,553,787 B1 | * | 4/2003 | Akiho et al. | ................. 65/17.3 |
| 6,755,049 B2 | * | 6/2004 | Korus et al. | ................. 65/17.3 |
| 2004/0025783 A1 | * | 2/2004 | Ohama et al. | ................ 117/19 |

FOREIGN PATENT DOCUMENTS

| EP | 1 094 039 A | 4/2001 | |
|---|---|---|---|
| WO | WO 00/59837 | * 10/2000 | ........... C03B/20/00 |

* cited by examiner

Primary Examiner—Steven P. Griffin
Assistant Examiner—Carlos Lopez
(74) Attorney, Agent, or Firm—Tiajoloff & Kelly

(57) ABSTRACT

Problems the invention is to solve: An object of the present invention is to provide a method for producing a quartz glass crucible capable of pulling up a silicon single crystal at a highly improved yield, yet without generating oscillation at the surface of the melt on pulling up silicon single crystal, and free from generating dislocations due to the peeling off of quartz glass fractions. Means for solving the problems: In a method for producing a quartz glass comprising a step of forming a base body comprising supplying a powder of silicon dioxide inside a rotating mold and thereby obtaining a molded body in the shape of a crucible by taking advantage of the centrifugal force, followed by heating and fusing the resulting molded body to obtain a translucent quartz glass crucible base body, and a step of forming an inner layer by newly supplying a powder of silicon dioxide into the heated atmosphere inside said crucible base body during or after forming said crucible base body, thereby forming an inner layer of a transparent quartz glass on the inner plane of said crucible base body, claimed is a method in which water vapor is introduced into said crucible base body in at least a part of the step for forming the inner layer.

9 Claims, 5 Drawing Sheets

METHOD FOR PRODUCING QUARTZ GLASS CRUCIBLE

TECHNICAL FIELD TO WHICH THE INVENTION BELONGS

The present invention relates a method for producing a quartz glass crucible suitably used in pulling up silicon single crystals.

RELATED ART

In general, a method for producing a quartz glass crucible comprises a step of forming a base body by supplying a powder of silicon dioxide inside a rotating mold to form a molded body in the shape of a crucible by using centrifugal force, followed by heating and fusing said molded body by means of arc frame to form a translucent quartz glass crucible body (outer layer), and a step of forming an inner layer by newly supplying a powder of silicon dioxide into the heated atmosphere inside said crucible base body during or after forming said crucible base body, thereby forming an inner layer of a transparent quartz glass on the inner plane of the crucible base body.

On the other hand, a so-called Czochralski (CZ) method is widely employed in the production of a silicon single crystal. The CZ method is a method comprising fusing the raw material, i.e., polycrystalline silicon, in a quartz glass crucible, joining a silicon single crystal as a seed crystal to the melt, and pulling up the seed crystal while rotating the quartz glass crucible and the seed crystal. In this manner, a cylindrical single crystal silicon can be grown.

In the CZ method, known as a serious problem encountered during the pulling up step after melting the polycrystalline silicon is the defective influence of oscillation that generates on the surface of the melt. If oscillation generates on the surface of the melt, there occurs problems such as making the so-called "seeding", i.e., the joining operation of the seed crystal to the silicon melt, or causing disorders in the crystal at the initial stage of the pulling up step, etc.

In order to overcome the problems above in JP-A-2000-72594 it was proposed to control the surface tension of the inner surface of a quartz glass crucible to 50 mN/m or lower by improving the wetting properties of the quartz glass crucible with respect to the silicon melt, by controlling the OH concentration, the surface roughness, and the metallic impurities of the surface inside the quartz glass crucible, thereby suppressing the oscillation of the melt surface Among them, the surface roughness and the metallic impurities accelerate the degradation of the inner surface of the quartz glass crucible. Thus, it is believed most preferable to select the OH concentration as a factor to be controlled.

In accordance with the published patent application above, there is proposed to control the absolute moisture of the melting and heating area, or the OH concentration of the silicon oxide powder itself. However, there were found disadvantages concerning the above proposal, such that the former not only increases the cost of the facilities but also causes difficulty in controlling the OH concentration to the desired level, and that the latter limits the powder raw material.

Another serious problem that generates during the pulling up step in the CZ method is the peeling of the quartz fractions from the inner surface of the quartz glass crucible. In general, a quartz glass crucible is produced in such a manner that it may have a double layered structure comprising a transparent inner layer free from pores and an opaque outer layer containing pores. However, with progressive pulling up at high temperatures under a reduced pressure, an apparently pore-free transparent layer sometimes produces pores and causes expansion as to bring about the peeling on the internal surface of the quartz glass crucible. If the quartz glass fractions peeled off from the crucible adhere to the single crystal during the pulling up, dislocations generate from such sites as to cause problems such as a serious decrease in the product yield.

As a means to overcome the problems above, in JP-A-2000-44286 it was proposed to suppress the pore expansion inside the quartz glass crucible which occurs within 1 mm from the internal surface of the crucible. More specifically, the publication above discloses changing the heating conditions in melting a quartz glass crucible, or selecting the silicon dioxide powder for use in the transparent layer of the quartz glass crucible.

However, it was difficult to surely suppress the pore expansion by the former method, because it has a wide allowance, and the former was found disadvantageous because it limited the raw material powder.

PROBLEMS THE INVENTION IS TO SOLVE

In the light of the aforementioned circumstances, it was found that, by employing a simple method comprising introducing water vapor into the crucible base body in the step for forming the inner layer during the production process of the quartz glass crucible, the OH concentration in the inner surface of the quartz glass crucible can be easily controlled independent to the silicon dioxide powder used, and the pore expansion can be suppressed from occurring in the vicinity of the inner surface. The present invention has been accomplished based on these findings.

More specifically, an object of the present invention is to provide a method for producing a quartz glass crucible capable of pulling up a silicon single crystal at a highly improved yield, yet without generating oscillation at the surface of the melt on pulling up silicon single crystal, and free from generating dislocations due to the peeling off of quartz glass fractions.

MEANS FOR SOLVING THE PROBLEMS

In order to overcome the problems above, there is provided a method for producing a quartz glass crucible, which, in a method comprising a step of forming a crucible base body comprising supplying a powder of silicon dioxide inside a rotating mold and thereby obtaining a molded body in the shape of a crucible, followed by heating and fusing the resulting molded body to obtain a translucent quartz glass crucible base body; and a step of forming an inner layer by newly supplying a powder of silicon dioxide into the heated atmosphere inside said crucible base body during or after forming said crucible base body, thereby forming an inner layer of a transparent quartz glass on the inner plane of said crucible base body; it is characterized by that water vapor is introduced into said crucible base body in at least a part of the step for forming the inner layer.

All the method steps during which a powder of raw material is supplied inside the rotating mold may be done by taking advantage of the centrifugal force.

In a preferred embodiment of the present invention, there is provided a method characterized by that the step of forming a crucible base body comprises using an apparatus for producing a quartz glass crucible equipped with a rotatable mold provided with an opening opened upward, followed by heating and fusing the resulting molded body by inserting an electrode from said opening and providing arc flame to obtain a translucent quartz glass crucible base body.

It is also possible to employ a constitution as such comprising, by using an apparatus for producing a quartz glass crucible equipped with a rotatable mold provided with an opening opened upward and a lid covering the upper side of said opening, heating and fusing the molded body by inserting an electrode from a penetrating hole provided to said lid and providing arc flame, newly supplying a powder of silicon dioxide into the heated atmosphere inside said crucible base body from said penetrating hole, and introducing water vapor into said crucible base body through said penetrating hole.

Preferably, the period of introducing the water vapor at least accounts for 25% of the step of forming the inner layer. Furthermore, preferred is that the period of introducing said water vapor is a part taken in a period of time between the initiation and the completion of supplying the powder of silicon dioxide, which is taken in said step of forming the inner layer. Although it is possible to introduce the water vapor in the step of forming the base body, care is necessary in such a case because the OH concentration of the entire crucible increases, and a wrong amount of water vapor should be introduced, a considerable decrease in viscosity of the quartz glass crucible is induced to result in a deformation of the shape.

The amount of the introduced water vapor is preferably controlled as such that the average concentration of OH groups contained to a depth of 1.0 mm from the surface of the inner layer of the transparent quartz glass formed in the step of forming the inner layer fall within a range of from 80 wt.-ppm to 350 wt.-ppm, and more preferably, from 100 wt.-ppm to 250 wt.-ppm.

In the formation of the inner layer, the amount of introduced water vapor is controlled as such that the amount should be in a range of from 0.5 to 100 parts with respect to the 100 parts by weight of silicon dioxide powder supplied in the step of forming the inner layer. However, since the amount of water vapor required differs depending on the size of the crucible, the amount of water vapor supplied in case of a crucible having an outer diameter of from 40 cm to 63.4 cm is in a range of from 0.5 to 40, preferably, 1 to 30 parts, with respect to 100 parts by weight of the silicon dioxide powder. In case of a crucible having an outer diameter of from 63.5 cm to 73.9 cm, the water vapor supplied is in a range of from 0.5 to 40, preferably, 1.5 to 50 parts; and for a crucible 74 cm to 125 cm in outer diameter, the water supplied is in a range of from 1.25 to 100, preferably, 2 to 80 parts, with respect to 100 parts by weight of the silicon dioxide powder.

The quantity of introducing water vapor as reduced to liquid per unit time is in a range of from 2 to 100 ml/min. However, this value depends on the size of the crucible, and is in a range of from 2 to 40 ml/min, preferably from 4 to 30 ml/min for a crucible 40 to 63.4 cm in diameter, for a crucible 63.5 to 73.9 cm in outer diameter, the above value is in a range of from 4 to 60 ml/min, preferably, 6 to 50 ml/min; and for a crucible 74 to 125 cm in outer diameter, the value is in a range of from 5 to 100 ml/min, preferably, 8 to 80 ml/min.

The silicon dioxide powder according to the present invention includes a naturally occurring or a synthetic amorphous or crystalline silicon dioxide, wherein the amorphous silicon dioxide powder is denoted as "quartz glass powder" and the crystalline silicon dioxide powder is denoted as "quartz powder". More specifically, for instance, while it is practical to use a naturally occurring quartz powder as the raw material powder for the outer layer, there may be used a mixture of a naturally occurring quartz glass powder, a synthetic quartz glass powder, a synthetic quartz powder, and various types of powders. Furthermore, although it is practical to use a synthetic quartz glass powder for the raw material powder of the inner layer, there may also be used a mixture comprising a synthetic quartz powder, a naturally occurring quartz powder, a naturally occurring quartz glass powder, and various types of powders.

EMBODIMENTS OF THE INVENTION

Figure 1:
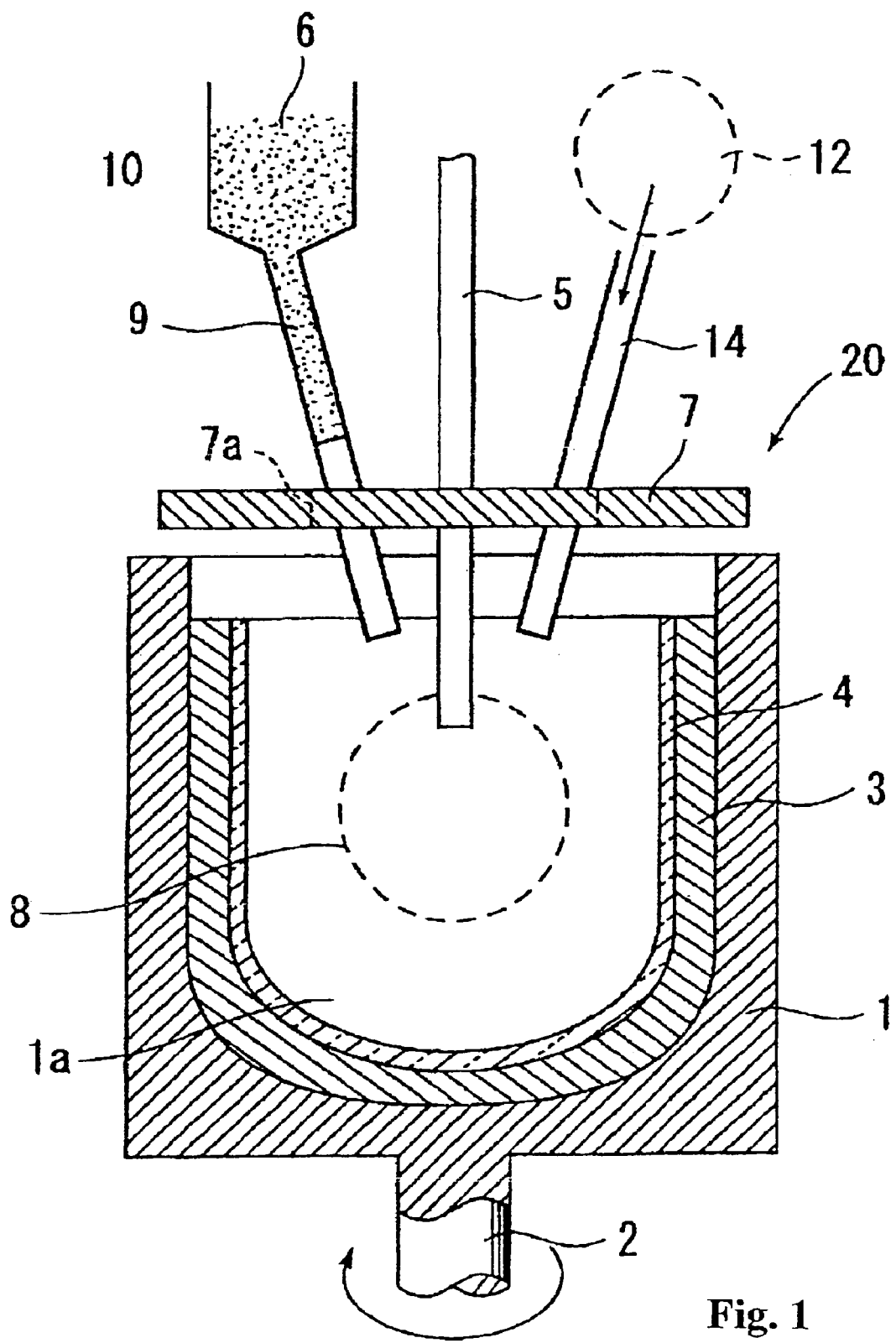
FIG. 1 is a schematically drawn explanatory diagram showing a cross section view of an apparatus for use in practicing the method according to the present invention and a method for producing a quartz glass crucible using said apparatus.

An embodiment according to the present invention is described below by making reference to FIG. 1 of the attached drawings. FIG. 1 is a schematic explanatory diagram showing a cross section view of an apparatus for use in practicing the method according to the present invention and a method for producing a quartz glass crucible using said apparatus. It should be understood, however, that the drawn embodiment is provided as an example, and that various modifications can be made thereto so long as the modifications comply with the technical idea of the present invention.

Referring to FIG. 1, an apparatus 20 for producing a quartz glass crucible is freely rotatable and comprises a mold 1 having an opening opened upward. The upper side of the opening of the mold 1 is covered with a lid 7. A penetrating hole 7a is bore at the central portion of the lid 7. The mold 1 is equipped with a rotatable shaft 2, and a cavity 1a is formed inside the mold 1. A translucent quartz glass crucible base body 3 constitutes the outer layer portion of the quartz glass crucible. The crucible base body 3 is formed by shaping a silicon dioxide powder, for instance, a naturally occurring quartz powder, into a molding of a desired shape inside the cavity 1a by making use of centrifugal force, and by then heating and fusing the silicon dioxide powder from the inner plane using an arc flame generated by a carbon electrode 5 (the step of forming the base body).

During or after forming the crucible base body 3, a high temperature gaseous atmosphere 8 is generated inside the crucible base body 3 by rotating and heating the mold 1 with an arc flame generated from the carbon electrode 5, and, at the same time, a silicon dioxide powder 6 is newly supplied in small portions through a noble 9 from a hopper 10 into the high temperature gaseous atmosphere 8. Thus, at least a part of the silicon dioxide powder 6 undergoes melting by the heat generated inside the temperature gaseous atmosphere 8, which, at the same time, it is scattered to the inner wall plane of the crucible base body 3 and adheres to the inner wall plane of the crucible base body 3. In this manner, a substantially pore-free transparent quartz glass inner layer 4 is formed integrated to the crucible base body 3 (i.e., the step of forming the inner layer). For details of the method for forming the translucent quartz glass crucible body 3 and the transparent quartz glass inner layer 4, reference can be made to JP-B-Hei4-22861.

The key of the method according to the present invention is that water vapor 12 is introduced inside the crucible base body 3 by using an introducing means 14 in at least a part of the period of the step for forming the inner layer, preferably, in at least a part of the period between starting and finishing supplying the silicon dioxide powder 6. The water vapor introduced inside the crucible base body 3 is then further introduced to the molten portion of the silicon dioxide powder.

The type and the method of introducing water vapor 12 is not limited, but water used therefor preferably is pure water with low impurity concentration, and more preferably, an ultra pure water. Thus, for instance, such water is evaporated by heating the water with a heating source such as a heater and the like, and by using the vapor pressure or a fan and the like, the resulting water vapor is introduced inside the crucible base body 3 by using, for instance, an introducing means 14 such as a quartz glass conduit and the like. Furthermore, a high pressure spray or other spray means may be used for the introduction of the water vapor, so long as the fine water particles sprayed by high pressure or by ultrasonic oscillation and the like may be in the form of water vapor at the introduction thereof inside the crucible base body 3.

In case of using a plate lid 7 provided with a penetrating hole 7a for inserting therein an electrode, the water vapor 12 is introduced through the penetrating hole 7a. In this case, the position of introducing water vapor is preferably as near as possible, preferably at a distance within 150 mm, to the supply site of the silicon dioxide powder that is supplied in the step of forming the inner layer.

Although it is possible to introduce the water vapor 12 in the step of forming the base body, care is necessary in such a case because the OH concentration of the entire crucible increases, and a wrong amount of water vapor should be introduced, a considerable decrease in viscosity of the quartz glass crucible is induced to result in a deformation of the shape.

As a silicon dioxide powder for use as the raw material for the quartz glass crucible, it is possible to properly select various types of powders such as a naturally occurring quartz powder, a synthetic quartz powder, a naturally occurring quartz glass powder, a synthetic quartz glass powder, etc. For instance, a naturally occurring quartz powder obtained by size reducing naturally occurring rock crystal, silicic sand, silica rock, etc., followed by purification, is suitable for a raw material of the outer layer of the quartz glass crucible according to the present invention, because it not only has advantage in cost but also the quartz glass crucible obtained therefrom exhibits excellent heat resistance.

Furthermore, as a powder with still higher purity, synthetic quartz glass powder is suitable as a raw material for the inner layer of the crucible. More specifically, a synthetic quartz glass powder can be properly selected from those obtained by means of a sol-gel process, soot process, flame combustion method, etc., by using a silicon alkoxide, a silicon halide (e.g., silicon tetrachloride, etc.), sodium silicate, and other silicon compounds as the starting material. Further, in addition to above, also usable are fumed silica, silica precipitates, etc.

Furthermore, in addition to a naturally occurring quartz powder or a synthetic quartz glass powder, there can be used as the raw material for producing the inner and the outer layers, for instance, a mixture of a naturally occurring quartz glass powder, a synthetic quartz powder, or various types of powders described above; as well as a powder containing an element (e.g., an aluminum compound, etc.) which contributes to the acceleration of crystallization or to the shielding of impurities, etc., depending on the desired physical properties (the state of the pores; the density, surface state, etc.) of the quartz glass crucible to be produced.

EXAMPLES

The present invention is described more specifically below by way of examples, but it should be understood that they are by no means limiting the present invention.

Example 1

By using the apparatus shown in FIG. 1, a naturally occurring quartz powder consisting of particles 100 to 300 μm in particle diameter was supplied to the inside of a rotating mold to form a molding consisting of a powder layer 30 mm in thickness by a method similar to that described above, and, at the same time with heating and fusing the molding from the inside thereof by using arc discharge, a synthetic quartz glass powder having an OH concentration of 5 ppm was supplied to the high temperature atmosphere thereof for a total of 4000 g at a rate of 100 g/min for 40 minutes, while supplying water vapor at a rate of 20 ml/min for 30 minutes to a total amount of 600 ml. Thus was formed a quartz glass crucible 22 inch in diameter provided with a transparent quartz glass inner layer having a thickness of from 1 mm to 3 mm over the entire inner surface of the crucible.

On measuring the average OH concentration in the inner surface of the resulting quartz glass crucible to a depth of 1.0 mm, a value of 200 wt.-ppm was obtained.

Figure 2:
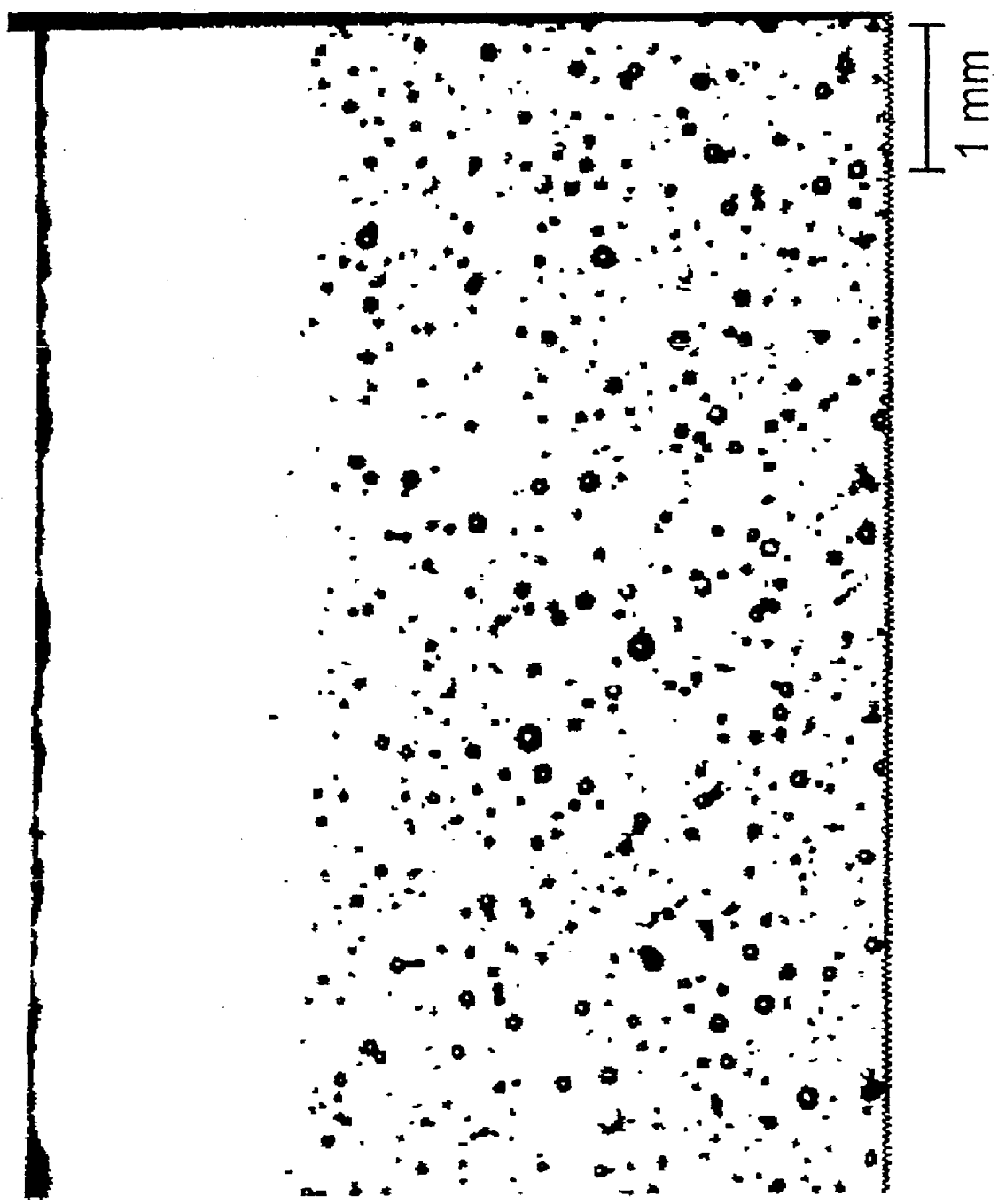
FIG. 2 is a micrograph showing a cross section view of the curved portion of a quartz glass crucible produced in Example 1.
Figure 3:
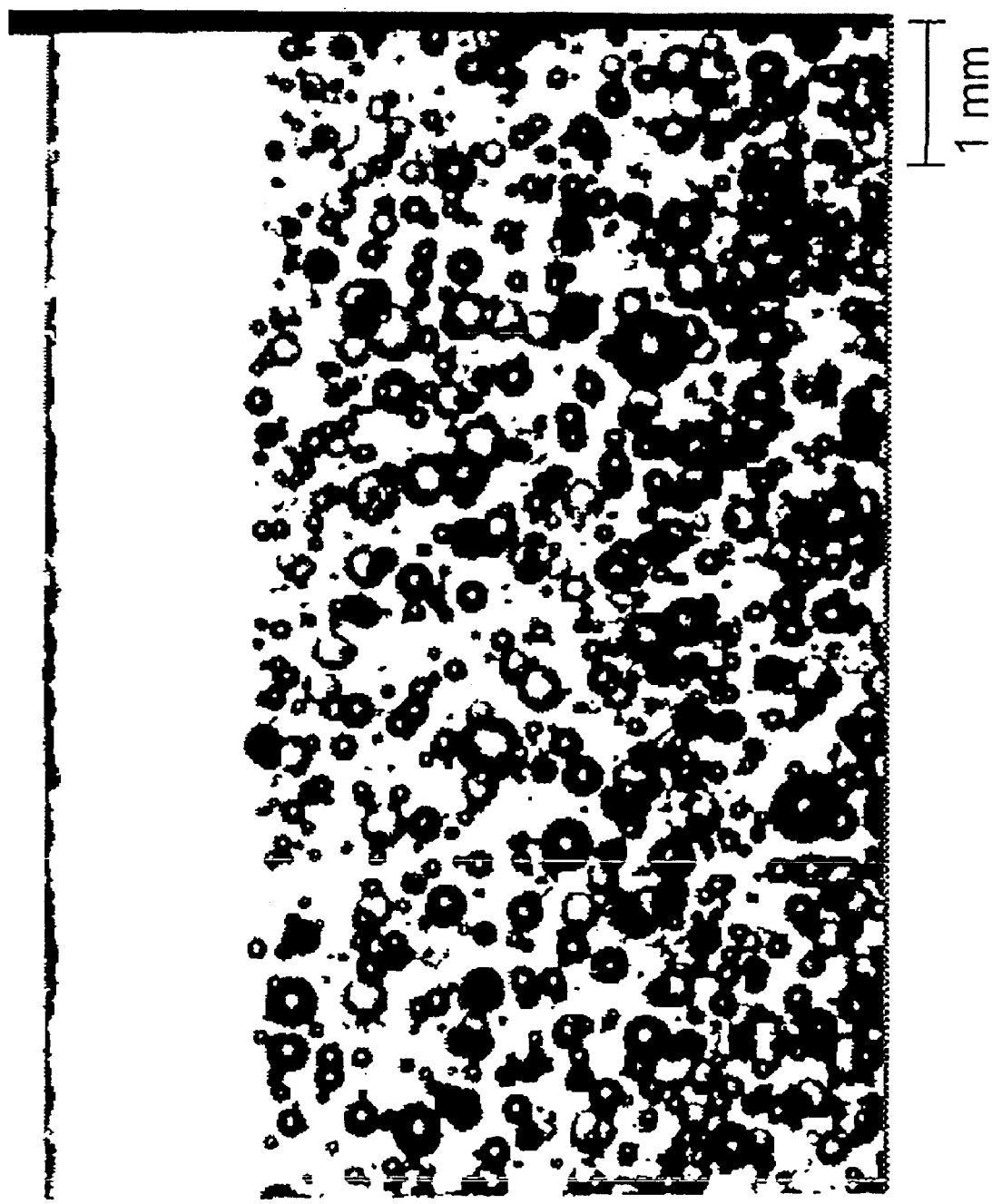
FIG. 3 is a micrograph showing a cross section view of the curved portion of a quartz glass crucible produced in Example 1 after pulling up a silicon single crystal using the quartz glass crucible.

On performing pulling up of a silicon single crystal by using the resulting quartz glass crucible under a reduced pressure, no oscillation generated on the surface of the silicon melt, and seeding was smoothly accomplished. Thus, a perfect single crystal of silicon was pulled up without generating dislocations and the like during the pulling up. On observing the transparent layer of the inner layer (transparent layer) of the quartz glass crucible after use, no pore expansion was observed in the vicinity of the inner surface. In FIG. 3 is shown a micrograph of the cross section of the curved portion (i.e., the Portion) of the used quartz glass crucible cut to a thickness of 1.0 mm. Furthermore, for comparative means, in FIG. 2 is shown a similar micrograph obtained for the curved portion of the quartz glass crucible before use.

Example 2

By a method similar to that described in Example 1, a naturally occurring quartz powder consisting of particles 100 to 300 μm in particle diameter was supplied to the inside of a rotating mold to form a molding consisting of a powder layer 30 mm in thickness, and, at the same time with heating and fusing the molding from the inside thereof by using arc discharge, a synthetic quartz glass powder having an OH concentration of 5 wt.-ppm was supplied to the high temperature atmosphere thereof for a total of 4000 g at a rate of 100 g/min for 40 minutes, while supplying water vapor at a rate of 5 ml/min for 16 minutes to a total amount of 80 ml. Thus was formed a quartz glass crucible 22 inch in diameter provided with a transparent quartz glass inner layer having a thickness of from 1 to 3 mm over the entire inner surface of the crucible.

On measuring the average OH concentration in the inner surface of the resulting quartz glass crucible to a depth of 1.0 mm, a value of 120 wt.-ppm was obtained.

On performing pulling up of a silicon single crystal by using the resulting quartz glass crucible under a reduced pressure, no oscillation was found to generate on the surface of the silicon melt, and seeding was smoothly accomplished. Thus, a perfect single crystal of silicon was pulled up without generating dislocations and the like during the pulling up. On observing the transparent layer of the inner layer (transparent layer) of the quartz glass crucible after use, no pore expansion was observed in the vicinity of the inner surface.

Example 3

By a method similar to that described in Example 1, a naturally occurring quartz powder consisting of particles 100 to 300 $\mu$m in particle diameter was supplied to the inside of a rotating mold to form a molding consisting of a powder layer 30 mm in thickness, and, at the same time with heating and fusing the molding from the inside thereof by using arc discharge, a synthetic quartz glass powder having an OH concentration of 5 wt.-ppm was supplied to the high temperature atmosphere thereof for a total of 4000 g at a rate of 100 g/min for 40 minutes, while supplying water vapor at a rate of 30 ml/min for 40 minutes to a total amount of 1200 ml. Thus was formed a quartz glass crucible 22 inch in diameter provided with a transparent quartz glass inner layer having a thickness of from 1 to 3 mm over the entire inner surface of the crucible.

On measuring the average OH concentration in the inner surface of the resulting quartz glass crucible to a depth of 1.0 mm, a value of wt.-250 ppm was obtained.

On performing pulling up of a silicon single crystal by using the resulting quartz glass crucible under a reduced pressure, no oscillation was found to generate on the surface of the silicon melt, and seeding was smoothly accomplished. Thus, a perfect single crystal of silicon was pulled up without generating dislocations and the like during the pulling up. On observing the transparent layer of the inner layer (transparent layer) of the quartz glass crucible after use, no pore expansion was observed in the vicinity of the inner surface.

Example 4

By a method similar to that described in Example 1, a naturally occurring quartz powder consisting of particles 100 to 300 $\mu$m in particle diameter was supplied to the inside of a rotating mold to form a molding consisting of a powder layer 30 mm in thickness, and, at the same time with heating and fusing the molding from the inside thereof by using arc discharge, a synthetic quartz glass powder having an OH concentration of 100 wt.-ppm was supplied to the high temperature atmosphere thereof for a total of 4000 g at a rate of 100 g/min for 40 minutes, while supplying water vapor at a rate of 20 ml/min for 30 minutes to a total amount of 600 ml. Thus was formed a quartz glass crucible 22 inch in diameter provided with a transparent quartz glass inner layer having a thickness of from 1 to 3 mm over the entire inner surface of the crucible.

On measuring the average OH concentration in the inner surface of the resulting quartz glass crucible to a depth of 1.0 mm, a value of 290 wt.-ppm was obtained.

On performing pulling up of a silicon single crystal by using the resulting quartz glass crucible under a reduced pressure, no oscillation was found to generate on the surface of the silicon melt, and seeding was smoothly accomplished. Thus, a perfect single crystal of silicon was pulled up without generating dislocations and the like during the pulling up. On observing the transparent layer of the inner layer (transparent layer) of the quartz glass crucible after use, no pore expansion was observed in the vicinity of the inner surface.

Example 5

By a method similar to that described in Example 1, a naturally occurring quartz powder consisting of particles 100 to 300 $\mu$m in particle diameter was supplied to the inside of a rotating mold to form a molding consisting of a powder layer 40 mm in thickness, and, at the same time with heating and fusing the molding from the inside thereof by using arc discharge, a synthetic quartz glass powder having an OH concentration of 5 wt.-ppm was supplied to the high temperature atmosphere thereof for a total of 10,000 g at a rate of 100 g/min for 100 minutes, while supplying water vapor at a rate of 50 ml/min for 100 minutes to a total amount of 5000 ml. Thus was formed a quartz glass crucible 30 inch in diameter provided with a transparent quartz glass inner layer having a thickness of from 1 to 3 mm over the entire inner surface of the crucible.

On measuring the average OH concentration in the inner surface of the resulting quartz glass crucible to a depth of 1.0 mm, a value of 220 wt-ppm was obtained.

On performing pulling up of a silicon single crystal by using the resulting quartz glass crucible under a reduced pressure, no oscillation was found to generate on the surface of the silicon melt, and seeding was smoothly accomplished. Thus, a perfect single crystal of silicon was pulled up without generating dislocations and the like during the pulling up. On observing the transparent layer of the inner layer (transparent layer) of the quartz glass crucible after use, no pore expansion was observed in the vicinity of the inner surface.

Comparative Example 1

By a method similar to that described in Example 1, a naturally occurring quartz powder consisting of particles 100 to 300 $\mu$m in particle diameter was supplied to the inside of a rotating mold to form a molding consisting of a powder layer 30 mm in thickness, and, at the same time with heating and fusing the molding from the inside thereof by using arc discharge, a synthetic quartz glass powder having an OH concentration of 5 wt.-ppm was supplied to the high temperature atmosphere thereof for a total of 4000 g at a rate of 100 g/min for 40 minutes. Thus was formed a quartz glass crucible 22 inch in diameter provided with a transparent quartz glass inner layer having a thickness of from 1 to 3 mm over the entire inner surface of the crucible.

On measuring the average OH concentration in the inner surface of the resulting quartz glass crucible to a depth of 1.0 mm, a value of 75 wt.-ppm was obtained.

Figure 4:
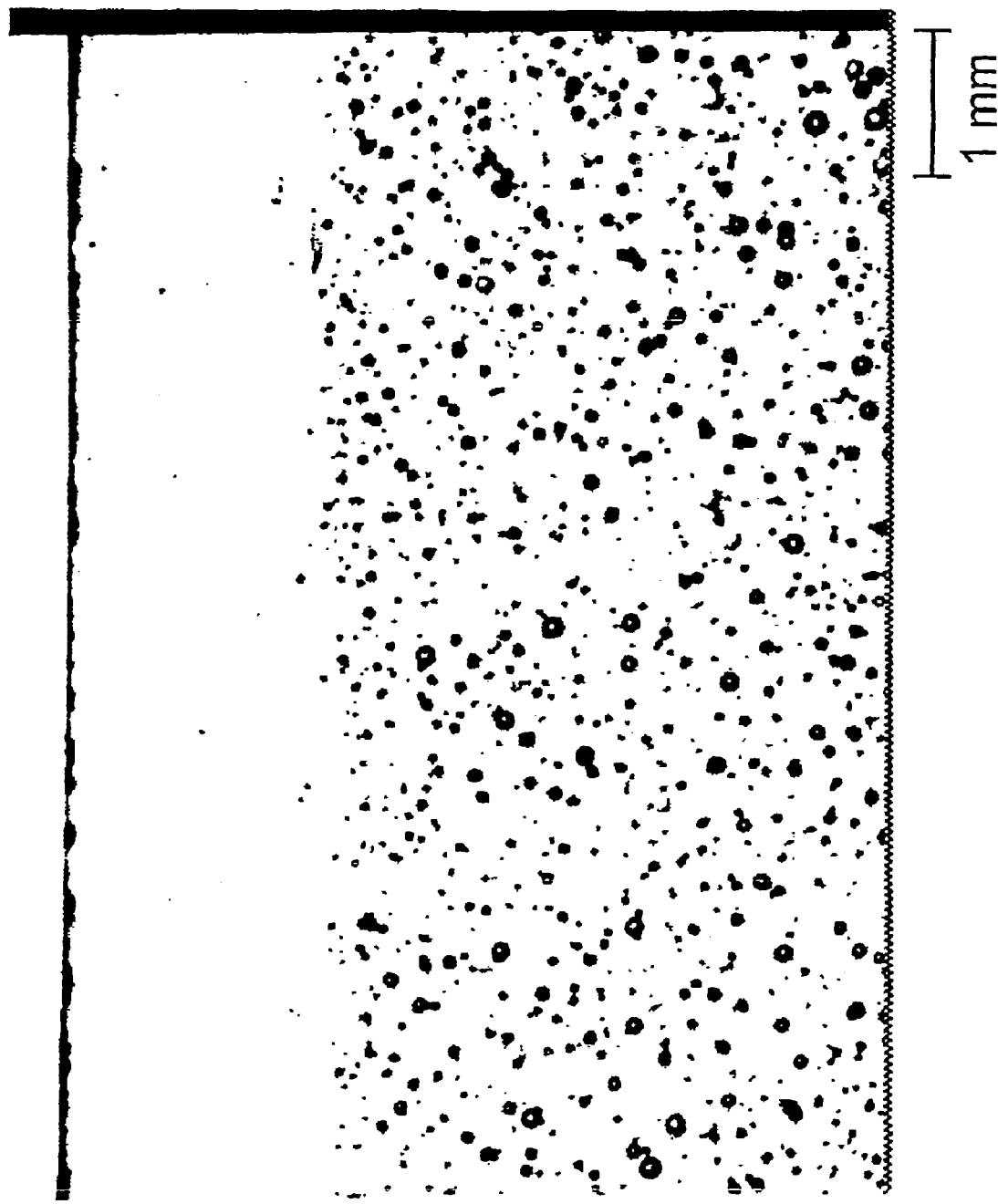
FIG. 4 is a micrograph showing a cross section view of the curved portion of a quartz glass crucible produced in Comparative Example 1.
Figure 5:
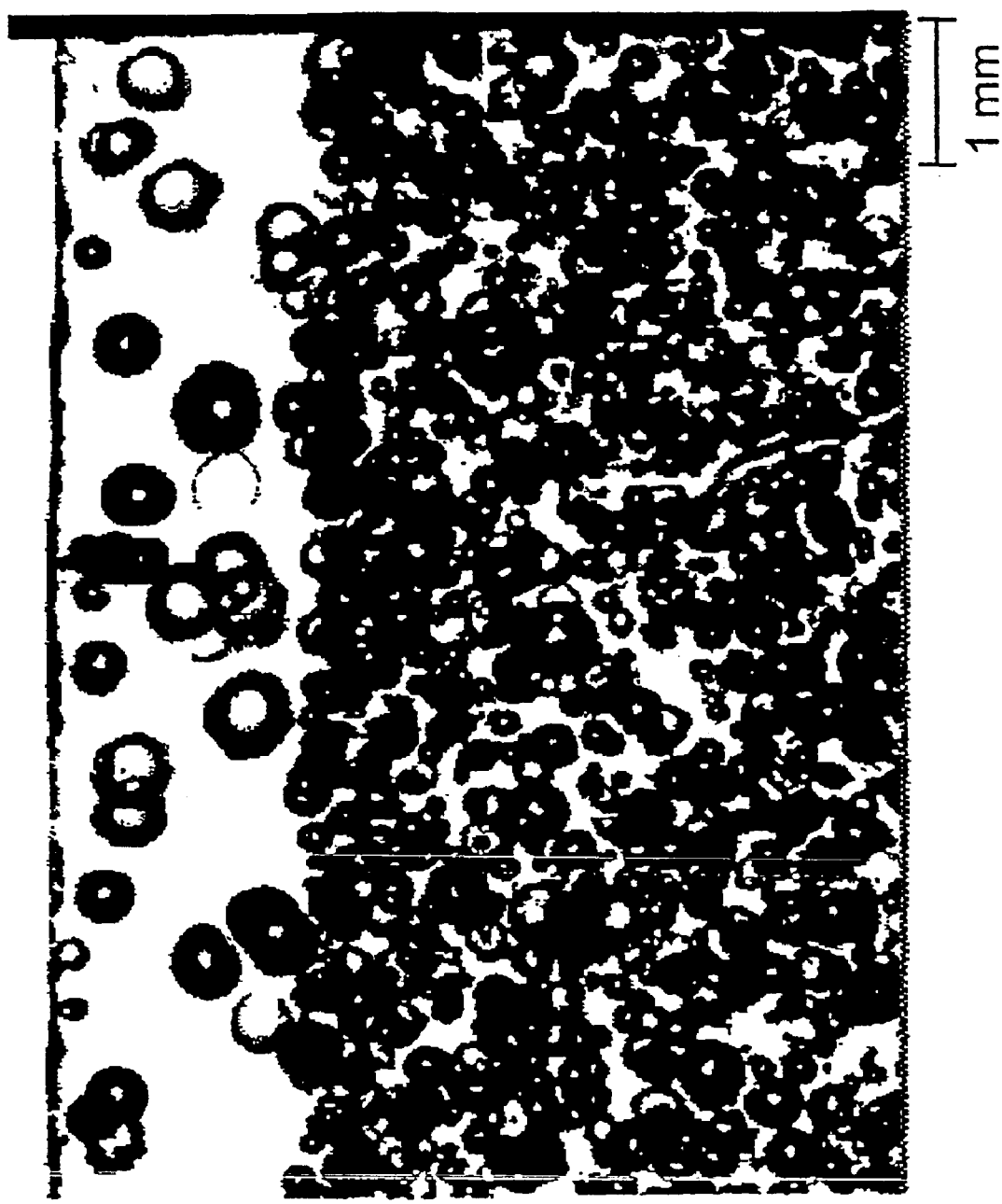
FIG. 5 is micrograph showing a cross section view of the curved portion of a quartz glass crucible produced in Comparative Example 1 after pulling up a silicon single crystal using the quartz glass crucible.

On performing pulling up of a silicon single crystal by using the resulting quartz glass crucible under a reduced pressure, oscillation was found to generate on the surface of the silicon melt, and seeding could not be smoothly performed in one time. Although the surface oscillation was found to settle during pulling up after the seeding, dislocations generated in the single crystal silicon in the later stage of pulling up, and the predetermined step was terminated before completion. On observing the transparent layer of the inner layer (transparent layer) of the quartz glass crucible after use, a severe pore expansion, which is believed to be the cause of forming dislocations, was found to generate. In FIG. 5 is shown a micrograph of the cross section of the curved portion (i.e., the r-portion) of the used quartz glass crucible cut to a thickness of 1.0 mm. For comparative means, in FIG. 4 is shown a similar micrograph obtained for the curved portion of the quartz glass crucible before use.

Effect of the Invention

As described above, in accordance with the method for producing a quartz glass crucible for use in pulling up single crystal silicon of the present invention, by employing a simple method comprising introducing water vapor into the crucible base body in the step for forming the inner layer during the production process of the quartz glass crucible, it was possible to achieve a great effect of providing a method for producing a quartz glass crucible capable of producing silicon single crystal at a highly improved yield, yet, without generating oscillation at the surface of the melt on pulling up silicon single crystal, and free from generating dislocations due to the peeling off of quartz glass fractions.

What is claimed is:

1. A method for producing a quartz glass crucible, said method comprising:

a step of forming a crucible base body, said step comprising supplying a powder of silicon dioxide inside a rotating mold and thereby obtaining a molded body in the shape of a crucible, followed by a step of heating and fusing the resulting molded body to obtain a translucent quartz glass crucible base body, and a step of forming an inner layer by newly supplying a powder of silicon dioxide into a heated atmosphere inside said crucible base body during or after forming said crucible base body, thereby forming an inner layer of a transparent quartz glass on an inner source of said crucible base body;

wherein water vapor is introduced into said heated atmosphere in at least part of the step for forming the inner layer.

2. A method as claimed in claim 1, wherein the step of forming a crucible base body comprises using an apparatus for producing a quartz glass crucible equipped with a rotatable mold provided with an opening opened upward, followed by said heating and fusing the resulting molded body by inserting an electrode from said opening and providing arc flame to obtain a translucent quartz glass crucible base body.

3. A method as claimed in claim 2, wherein the rotatable mold is provided with a lid covering the upper side of said opening, the heating and fusing The molded body being accomplished by inserting the electrode through a penetrating hole provided in said lid and providing arc flame, newly supplying the powder of silicon dioxide into the heated atmosphere inside said crucible base body through said penetrating hole, and introducing the water vapor into said crucible base body through said penetrating hole.

4. A method as claimed in claim 1, wherein the introducing of said water vapor is at least partly taken in a period of time between the initiation and the completion of supplying the powder of silicon dioxide in said step of forming the inner layer.

5. A method as claimed in claim 1, wherein the introducing of said water vapor is for a period that accounts for at least 25% of the step of forming the inner layer.

6. A method as claimed in claim 1, wherein the water vapor is supplied in a controlled way so that the supplied quantity is in a range of from 0.5 to 100 with respect to the 100 parts by weight of silicon dioxide powder supplied in said step deforming the inner layer.

7. A method as claimed in claim 1, wherein the water vapor introduced in said step of forming the inner layer is introduced in a quantity that is controlled so that said water vapor is supplied at a supply rate per unit time fall in a range of from 2 to 100 mi/mm as reduced to liquid.

8. A production method as claimed in claim 1, wherein the powder of silicon dioxide supplied in said step of forming the inner layer is a raw powder material of amorphous silica.

9. A method for producing a quartz glass crucible, said method comprising:

a step of forming a crucible base body, said step comprising supplying a powder of silicon dioxide inside a rotating mold and thereby obtaining a molded body in the shape of a crucible, followed by a step of heating and fusing the resulting molded body to obtain a translucent quartz glass crucible base body, and a step of forming an inner layer by newly supplying a powder of silicon dioxide into a heated atmosphere inside said crucible base body during or after forming said crucible base body, thereby forming an inner layer of a transparent quartz glass on an inner surface of said crucible base body;

wherein water vapor is introduced into said heated atmosphere in at least a part of the step for forming the inner layer; and wherein the quantity of introduced water vapor is controlled so that OH groups contained to a depth of 1.0 mm from the surface of the inner layer of said transparent quartz glass formed in said step of forming the inner layer have an average concentration that falls within a range of from 80 wt.-ppm to 350 wt-ppm.

* * * * *